(12) United States Patent
Johansson et al.

(10) Patent No.: US 9,474,154 B2
(45) Date of Patent: Oct. 18, 2016

(54) REFLOW SOLDERABLE FLEXIBLE CIRCUIT BOARD — TO — FLEXIBLE CIRCUIT BOARD CONNECTOR REINFORCEMENT

(71) Applicant: Starkey Laboratories, Inc., Eden Prairie, MN (US)

(72) Inventors: Susie Johansson, Eden Prairie, MN (US); Andy Lambert, Eden Prairie, MN (US)

(73) Assignee: Starkey Laboratories, Inc., Eden Prairie, MN (US)

(*) Notice: Subject to any disclaimer, the term of this patent is extended or adjusted under 35 U.S.C. 154(b) by 0 days.

(21) Appl. No.: 14/335,513

(22) Filed: Jul. 18, 2014

(65) Prior Publication Data

US 2016/0021742 A1    Jan. 21, 2016

(51) Int. Cl.
*H05K 1/09* (2006.01)
*H05K 1/11* (2006.01)
(Continued)

(52) U.S. Cl.
CPC .............. *H05K 1/111* (2013.01); *H04R 25/60* (2013.01); *H05K 1/0281* (2013.01); *H05K 1/0393* (2013.01); *H05K 3/303* (2013.01); *H05K 3/34* (2013.01); *H05K 3/363* (2013.01); *H05K 1/189* (2013.01); *H05K 2201/10189* (2013.01)

(58) Field of Classification Search
CPC ............ H05K 1/00; H05K 1/02; H05K 7/02; H01R 12/00; H01R 12/02; H01R 12/16; H01R 12/61; H01R 13/648; H01R 13/66; G06F 1/18

USPC ............... 174/251, 254, 268, 535, 541, 557; 439/62, 65–67, 69, 108, 260, 607.05, 439/620.21, 660; 396/176, 542; 345/173; 361/679.02, 749, 752, 760

See application file for complete search history.

(56) References Cited

U.S. PATENT DOCUMENTS

| 4,756,940 A | 7/1988 | Payne et al. |
| 5,201,671 A | 4/1993 | Elias |

(Continued)

FOREIGN PATENT DOCUMENTS

WO    WO-2006030352 A2    3/2006

OTHER PUBLICATIONS

"European Application Serial No. 15177399.1, Extended European Search Report mailed Dec. 1, 2015", 8 pgs.

*Primary Examiner* — Xiaoliang Chen
(74) *Attorney, Agent, or Firm* — Schwegman Lundberg & Woessner, P.A.

(57) ABSTRACT

A system embodiment may include a first flexible substrate with a first number of conductors, the first flexible substrate configured to be mechanically flexed. The system may further include a surface mounted device (SMD) mounted on the first flexible substrate and connected to at least some of the first number of conductors, and a first board-to-board connector element connected to at least some of the first number of conductors on a first side of the substrate. The first board-to-board connector element is configured to mechanically connect to a second board-to-board connector element on a second flexible substrate and to electrically connect at least some of the first number of conductors in the first flexible substrate to at least some conductors in the second flexible substrate. The system may further include a stiffener board connected by solder to a second side of the first flexible substrate opposite the board-to-board connector element.

14 Claims, 5 Drawing Sheets

(51) Int. Cl.
  *H04R 25/00* (2006.01)
  *H05K 1/02* (2006.01)
  *H05K 1/03* (2006.01)
  *H05K 3/30* (2006.01)
  *H05K 3/34* (2006.01)
  *H05K 3/36* (2006.01)
  *H05K 1/18* (2006.01)

(56) References Cited

U.S. PATENT DOCUMENTS

| | | | |
|---|---|---|---|
| 5,482,473 A * | 1/1996 | Lord et al. | 439/67 |
| 5,603,619 A * | 2/1997 | Turner et al. | 439/69 |
| 5,616,050 A | 4/1997 | Suski | |
| 5,748,448 A * | 5/1998 | Hokari | 361/749 |
| 5,903,059 A | 5/1999 | Bertin et al. | |
| 5,995,855 A * | 11/1999 | Kiani et al. | 600/310 |
| 6,210,174 B1 | 4/2001 | Pei et al. | 439/67 |
| 6,299,476 B1 * | 10/2001 | Schramme et al. | 439/496 |
| 6,462,955 B1 * | 10/2002 | Roberts | 361/749 |
| 6,508,661 B1 * | 1/2003 | Yu | 439/495 |
| 6,551,113 B1 * | 4/2003 | Nishiyama et al. | 439/67 |
| 6,769,922 B1 * | 8/2004 | Lee et al. | 439/74 |
| 7,033,208 B1 | 4/2006 | Huang et al. | 439/498 |
| 7,294,019 B1 * | 11/2007 | Jeon | 439/607.05 |
| 7,322,832 B2 | 1/2008 | Kronich et al. | |
| 7,612,290 B1 | 11/2009 | Le | |
| 7,916,118 B2 | 3/2011 | Ao et al. | |
| 8,333,598 B2 * | 12/2012 | Mulfinger et al. | 439/67 |
| 2003/0003779 A1 * | 1/2003 | Rathburn | 439/66 |
| 2003/0205826 A1 | 11/2003 | Lin et al. | |
| 2004/0081328 A1 | 4/2004 | Leedom et al. | |
| 2004/0127092 A1 * | 7/2004 | Yamada et al. | 439/498 |
| 2005/0181636 A1 | 8/2005 | Tsui et al. | |
| 2005/0215109 A1 * | 9/2005 | Satou | 439/492 |
| 2005/0227508 A1 | 10/2005 | Syms | |
| 2005/0287834 A1 * | 12/2005 | Nishimura et al. | 439/67 |
| 2006/0009048 A1 * | 1/2006 | Hsieh | 439/65 |
| 2007/0004256 A1 | 1/2007 | Jang et al. | |
| 2007/0037436 A1 * | 2/2007 | Iwahori | 439/422 |
| 2007/0177749 A1 | 8/2007 | Sjursen et al. | |
| 2008/0156365 A1 | 7/2008 | Scholz et al. | |
| 2008/0266819 A1 * | 10/2008 | Su et al. | 361/752 |
| 2008/0268702 A1 * | 10/2008 | Little et al. | 439/541.5 |
| 2009/0017670 A1 | 1/2009 | Hattori | |
| 2009/0056988 A1 | 3/2009 | Lin et al. | |
| 2009/0057888 A1 | 3/2009 | Hunter | |
| 2009/0130867 A1 * | 5/2009 | Kudo et al. | 439/76.1 |
| 2009/0186496 A1 | 7/2009 | Cheng | |
| 2010/0085693 A1 * | 4/2010 | Koshiishi | 361/679.02 |
| 2010/0331060 A1 * | 12/2010 | Yoshida | 455/575.1 |
| 2011/0051382 A1 * | 3/2011 | Yumoto et al. | 361/749 |
| 2011/0115731 A1 * | 5/2011 | Kuwajima | 345/173 |
| 2011/0206316 A1 * | 8/2011 | Wang et al. | 385/14 |
| 2011/0255850 A1 * | 10/2011 | Dinh et al. | 396/176 |
| 2012/0314383 A1 * | 12/2012 | Oohira | 361/749 |
| 2012/0329333 A1 * | 12/2012 | Ho | 439/660 |
| 2013/0161078 A1 * | 6/2013 | Li | 174/254 |
| 2013/0294628 A1 | 11/2013 | Higgins et al. | |
| 2013/0307380 A1 * | 11/2013 | Zeng et al. | 310/68 R |
| 2013/0337688 A1 * | 12/2013 | Zong et al. | 439/620.21 |
| 2014/0144678 A1 * | 5/2014 | Lin et al. | 174/254 |
| 2014/0212127 A1 * | 7/2014 | Chen | 396/542 |
| 2015/0162388 A1 * | 6/2015 | Kim | 257/40 |
| 2015/0357733 A1 * | 12/2015 | Sanford et al. | 361/749 |

* cited by examiner

REFLOW SOLDERABLE FLEXIBLE CIRCUIT BOARD — TO — FLEXIBLE CIRCUIT BOARD CONNECTOR REINFORCEMENT

TECHNICAL FIELD

This document relates generally to flexible circuits and more particularly to flexible circuit assemblies with board-to-board connectors to connect a flexible circuit or flexible circuit assembly to another flexible circuit or flexible circuit assembly and a method to provide connector reinforcement.

BACKGROUND

Flexible electronics, also referred to as flex assemblies, is a technology in which electronic devices may be mounted on flexible substrates. These devices mounted onto the flexible substrate may be referred to as surface mounted devices (SMDs). Examples of such substrates include but are not limited to polyimide or PEEK. The completed flexible electronic assembly may conform to a desired shape or may flex during use, such as may be desirable for tightly assembled electronic packages or where the assembly is required to flex during normal use. By way of example and not limitation, hearing aids or other hearing assistance devices may be fabricated using flexible electronics. Flexible electronics may be passive wiring structures used to interconnect integrated circuits and other electronic SMDs. Flexible electronics may be used to make interconnections to electronic assemblies directly or by use of connectors to a secondary electronic assembly.

A segmented flex assembly may include more than one flex circuit segments. These flex circuit segments, which may be referred to as flex circuit boards, may be connected using board-to-board connectors. Board-to-board connectors may be surface mounted on to flexible circuits. Elements of a board-to-board connector may include a board-to-board connector plug and a complementary board-to-board connector receptacle. It is desirable to increase the robustness of these board-to-board connectors.

Given the flexibility of the substrate on which the board-to-board connectors are attached, reliability issues may arise without a stiffener to support the flexible circuit in the location of the board-to-board connectors. For example, the lack of a stiffener may lead to bent or broken connectors during assembly and repair, and may lead to circuit delamination during the detaching process, with the connector tearing apart from the flex. A stiffener may be fabricated using a rigid material, such as polyethylene terephthalate (PET), FR4 board or stainless steel. PET is a thermoplastic polymer resin, and an FR4 board is a glass epoxy which has been used to fabricate printed circuit boards (PCBs). Generally the stiffener is either built into the board during the fabrication process or attached during subsequent assembly steps using an adhesive. Building the stiffener into the board during the fabrication process greatly increases the price of the flexible circuit assembly. Fabricating the stiffener into the board also reduces the circuit board's versatility, as the presence of the stiffener on one side limits the locations connectors can be attached and the resulting possible assembly orientations of the flexible circuit. A stiffener may be attached post assembly, but the additional assembly steps require additional time and materials. For example, common methods involve the use of either a thermoset or pressure sensitive adhesive. These methods are generally complicated, with the adhesives and stiffener boards supplied separately and combination completed in house by assembly operators.

Underfilling may involve a process in which epoxy or other adhesives are applied under SMD(s) mounted on the flexible substrate, and then cured to harden. However, underfill cannot be effectively used to further reinforce the connector without the need for a stiffener, as underfilling can wick into the connectors, preventing them from making electrical connections and functioning properly.

Accordingly, there is a need in the art for improving flexible circuit assemblies, including improving connections between boards of the flexible circuit assemblies.

SUMMARY

Disclosed herein, among other things, are systems and methods for reinforcing board-to-board connectors that connect a flexible circuit or flexible circuit assembly to another flexible circuit or flexible circuit assembly. By way of example, an embodiment of a system may include a first flexible substrate with a first number of conductors, the first flexible substrate configured to be mechanically flexed. The system may further include a surface mounted device (SMD) mounted on the first flexible substrate and connected to at least some of the first number of conductors, and a first board-to-board connector element connected to at least some of the first number of conductors on a first side of the substrate. The first board-to-board connector element is configured to mechanically connect to a second board-to-board connector element on a second flexible substrate and to electrically connect at least some of the first number of conductors in the first flexible substrate to at least some conductors in the second flexible substrate. The system may further include a stiffener board connected to a second side of the first or second flexible substrate opposite the board-to-board connector element by a solder connection.

An embodiment of a system may comprise a first flex circuit segment and a second flex circuit segment. The first flex circuit segment may include a first flexible substrate with a first number of conductors, a first surface mounted device (SMD) mounted on the first flexible substrate and connected to at least some of the first number of conductors, a first board-to-board connector element on a first side of the first flexible substrate connected to at least some of the first number of conductors, and a first stiffener board connected to a second side of the first flexible substrate opposite the board-to-board connector element. The second flex circuit segment may include a second flexible substrate with a second number of conductors, a second SMD mounted on the second flexible substrate and connected to at least some of the second number of conductors, a second board-to-board connector element on a first side of the second flexible substrate connected to at least some of the second number of conductors, and a second stiffener board connected to a second side of the second flexible substrate opposite the board-to-board connector element. The first and second board-to-board connector elements are configured to mechanically connect to each and to electrically connect at least some of the first number of conductors to at least some of the second number of conductors.

An embodiment of a method includes assembling a flex circuit, which may include assembling SMD(s) on a flexible substrate that has a first major surface and a second major surface. Assembling SMD(s) may include preparing mounting pads on the flexible substrate. The mounting pads includes at least a first mounting pad on the first major surface of the flexible substrate, at least a second mounting pad on the second major surface, the first and second mounting pads being on opposing sides of the flexible substrate to cause the first and second mounting pads to sandwich the flexible substrate, and at least one other mounting pad on the first major surface or the second major surface. The method may further include machine assisted, automatic picking and placing SMD(s) onto the mounting pads. The SMD(s) include at least one surface mounted device (SMD), a connection element and a stiffener board. At least one SMD may be mounted onto at least one other mounting pad. The connection element may be mounted to one of the first or the second mounting pads. A stiffener board maybe mounted to the other one of the first or second mounting pads.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

DETAILED DESCRIPTION

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

This document refers generally to flexible circuits or flexible circuit assemblies. Flexible circuit assemblies may include one or more flexible substrates that may be connected to each other to form the assembly. Each flexible substrate and the circuitry and the SMDs thereon may be referred to as a flexible circuit or flexible circuit assembly or more simply as a flex circuit or flex assembly.

Figure 1:
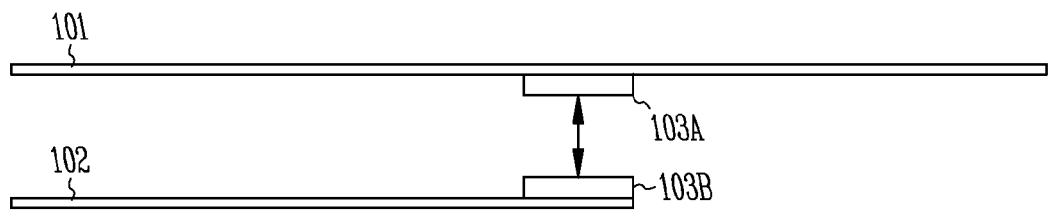
FIG. 1 illustrates, by way of example and not limitation, flex circuits and a board-to-board connector mating pair between flex circuits.

FIG. 1 illustrates, by way of example and not limitation, flex circuits and a board-to-board connector mating pair between flex circuits. Each of the flex circuits 101 and 102 is illustrated generally as a flexible substrate with board-to-board connector elements 103A-B attached thereon. The board-to-board connector elements are configured to mechanically connect the flexible substrates and to electrically connect at least some of the conductors in the flexible substrate of the flex circuit 101 to at least some conductors in the flexible substrate of the flex circuit 102. The connector elements 103A-B may have a cooperative relationship such as a plug/receptacle relationship.

The flexible substrates may be cut from a panel of flex (e.g. a panel of two-layer flex or a panel of four-layer flex by way of example), depending on the design of the flex circuit assembly. The cut flexible substrates have two major surfaces (e.g. a top surface and a bottom surface). SMD(s) may be mounted to either major surface or some SMD(s) may be mounted on one surface and other SMD(s) may be mounted on the other surface. The final design of the flexible circuit may be segmental, in which multiple flex circuits connect together to form a final flex assembly. One or more SMD(s) may be on one of the flexible substrates, and one or more SMD(s) may be on another of the flexible substrates.

Figure 2:
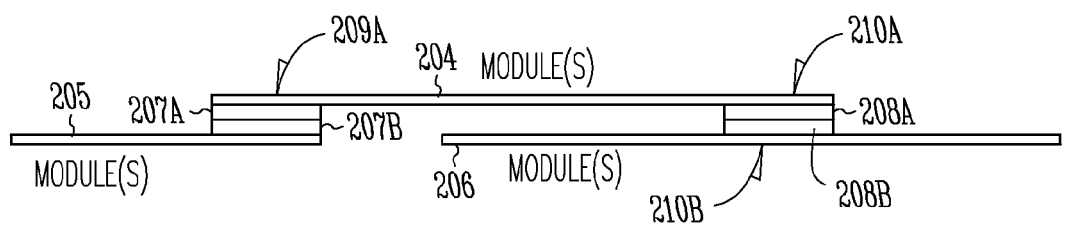
FIG. 2 illustrates, by way of example and not limitation, a segmented system fabricated using flex circuits and multiple board-to-board mating pairs.
Figure 3:
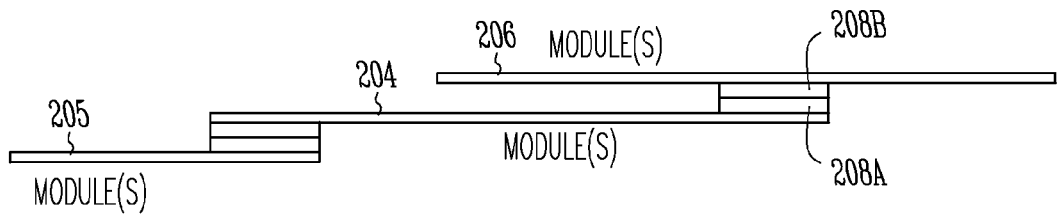
FIG. 3 illustrates, by way of example and not limitation, another connection arrangement of the flex circuits of FIG. 2.

FIG. 2 illustrates, by way of example and not limitation, a segmented system fabricated using flex circuits and multiple board-to-board mating pairs. The illustrated system forms a flex assembly using a first flex circuit segment 204, a second flex segment circuit 205, and a third flex segment circuit 206, where each flex circuit segment has one or more SMD(s) mounted thereon. FIG. 2 illustrates connector elements 207A-B for connecting the first flex circuit segment 204 to the second flex circuit segment 205, and further illustrates connector elements 208A-B for connecting the first flex circuit segment 204 to the third flex circuit segment 206. Each of the flex circuit segments also includes at least one area in which a board-to-board connector element may be mounted. This area may be referred to as a mounting pad area. An example of a mounting pad area is a solder pad. In some embodiments, the flex circuit may be designed to allow a board-to-board connector element to be mounted on either major surface (i.e. either on the top surface or bottom surface) in the same area of the flex circuit. Thus, for example, board-to-board connector element 207A may be positioned at 209A on the other major surface of the first flex circuit segment 204, and/or board-to-board connector element 207B may be positioned at 209B on the other major surface of the second flex circuit segment 205. Also, board-to-board connector element 208A may be positioned at 210A on the other major surface of the first flex circuit segment 204, and/or board-to-board connector element 208B may be positioned at 210B on the other major surface of the third flex circuit segment 206. This capability provides flexibility in working with the segmented design of the flex circuits when assembling the flex circuits into the completed flex circuit assembly. By way of example and not limitation, FIG. 3 illustrates another connection arrangement of the flex circuits of FIG. 2. As illustrated, the third flex circuit segment 206 is connected on top of the first flex circuit segment 204 using connectors 208A-B.

Figure 4:
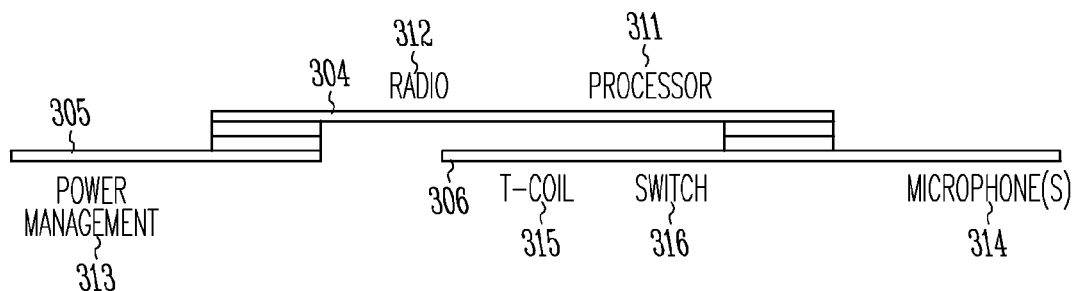
FIG. 4 illustrates, by way of example and not limitation, a segmented design implemented using flex circuits for a hearing assistance device.

FIG. 4 illustrates, by way of example and not limitation, a segmented design using flex circuits for a hearing assistance device. A first flex circuit segment 304 may function as a mainboard with a DSP processor package 311. The first flex circuit segment 304 may also have a radio package 312 configured to provide the hearing assistance device with wireless communication capabilities. A second flex circuit segment 305 may also have a power management package 313, and a third flex circuit 306 may have one or more microphones 314, a telecoil ("t-coil") 315, and a switch 316 configured to be manipulated by a user of the hearing assistance device. The telecoil 315 may be designed to pick up an electromagnetic signal for conversion to a sound for presentation to the user, and the switch may be configured to allow the user to change whether the sound presented to the user is the ambient sound or a sound converted from the electromagnetic signal. Each of these modules may be implemented in a number of hearing assistance device designs, including different hearing aid styles such as behind-the-ear or receiver-in-canal designs, and including left and right hearing aids. For example, the ability to connect on either side of a flex circuit may allow a flex circuit to be assembled in a right hearing aid or a symmetrical left hearing aid. The flex circuit segments of the flexible circuit assembly may be flipped or folded differently.

Figure 5:
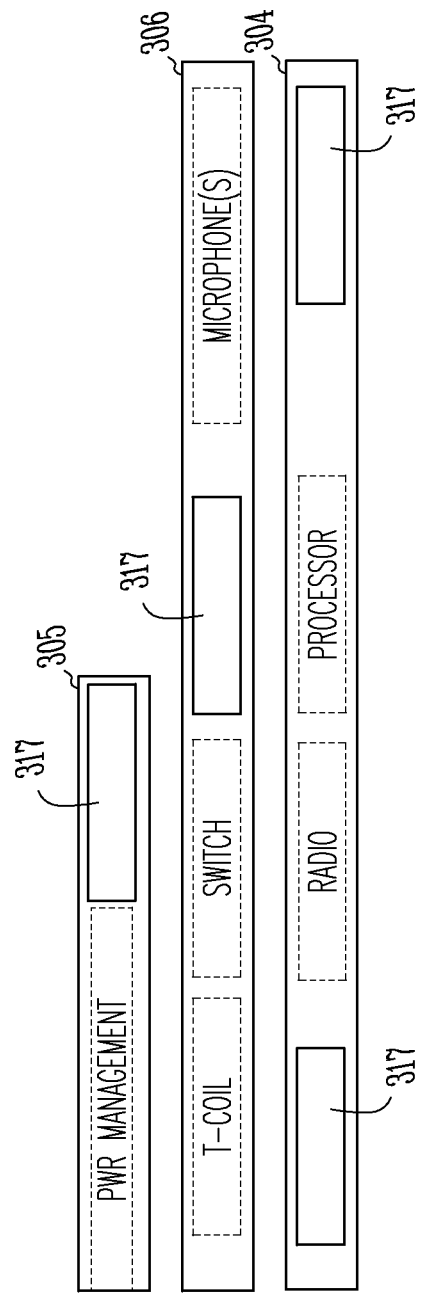
FIG. 5 illustrates, by way of example and not limitation, a planar view of the flex circuit segments of FIG. 4.

FIG. 5 illustrates, by way of example and not limitation, a planar view of the flex circuit segments of FIG. 4. If the flexible substrate has a rectangular footprint rather than a more irregular shape, more flexible substrates may be cut from a given panel of flex. Any segment may be on either major surface of corresponding flexible substrate. Flexible circuits may be designed with connector footprints on both sides of the circuit, allowing for a connector to be attached to either side. These footprints may be referred to as a connector area 317 used to mount a connector element (e.g. connector plug or connector receptacle). For example, the flexible circuit may be designed for use within a variety of hearing aids, and to fit within a behind-the-ear hearing aid with the connector on one side of the circuit and to fit within a receiver-in-canal hearing aid with the connector on the other side of the circuit, thus increasing the circuits re-usability. The connector area 317 may be a solder pad on which the connector element or stiffener board may be mounted. Thus, according to various embodiments, a connector element (e.g. plug or receptacle) may be mounted in this area 317 on one of the major surfaces, and a stiffener board may be mounted in this area 317 on the other one of the major surfaces.

Figure 6:
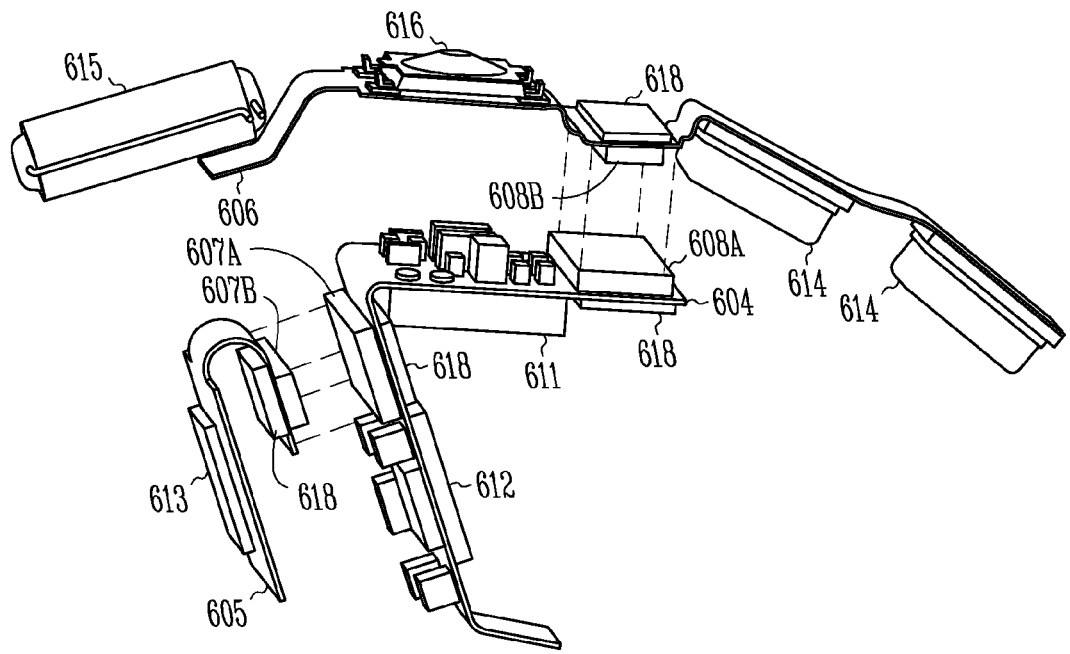
FIG. 6 illustrates, by way of example and not limitation, a perspective view of a segmented design of a hearing assistance device.

FIG. 6 illustrates, by way of example and not limitation, a perspective view of a segmented design of a hearing assistance device. A first flex circuit segment 604 may function as a mainboard with a DSP processor package 611. The first flex circuit segment 604 may also have a radio package 612 configured to provide the hearing assistance device with wireless communication capabilities. A second flex circuit segment 605 may have a power management package 613, and a third flex circuit segment 606 may have one or more microphones 614, a telecoil ("t-coil") 615, and a switch 616 configured to be manipulated by a user of the hearing assistance device. The first flex circuit segment 604 may include connector receptacles 607A and 608A. The second flex circuit segment 605 may include a connector plug 607B configured to cooperate with receptacle 607A to mechanically and electrically connect the first and second flex circuit 604 and 605. The third flex circuit segment 606 may include a connector plug 608B configured to cooperate with receptacle 608A to mechanically and electrically connect the first and third flex circuit segments 604 and 606. The placement of a connector element on one side leaves the other side electrically open and the connector with little mechanical support for mating and un-mating. A piece of material, such as FR4, with solder balls previously printed onto it could be placed on the open location during that respective side's reflow process. A stiffener board 618 may be mounted on the opposite surface of the flex circuit from the surface on which the connector element 607A, 607B, 608A, 608B is mounted. The footprint of the stiffener board 618 may be the same or approximately the same as the footprint of the connector element.

The material of the stiffener board may be any rigid material that is not solid metal. Examples of such material include, but are not limited to, FR4 board, acrylic, epoxy, polyimide, kapton, ceramic, silicon, and the like. The rigid material may contain solder pads consisting of ENIG finish or other pad finishes. The rigid material may also contain small solder balls on top of the pads. The pads are not used for any electrical connection purposes, but rather are used as means for mechanically attaching the stiffener to the flexible substrate on the opposite side of the board-to-board connector. The rigid material can be supplied to the pick-and-place machine for mounting on the flexible electronics by a number of methods, including by way of example and not limitation, by tape and reel and waffle pack. The flexible circuit to which the rigid material will be attached contains solder pads to match those of the rigid material. In the case of solder balls on the rigid material, flux is applied to the flexible circuit pads per the normal flux printing process and the stiffener attached during the normal pick and place process. In the case of no solder balls and only solder pads on the stiffener, solder paste is applied to the flexible circuit pads per the normal solder paste printing process and the stiffener attached during the normal pick and place process. The entire flexible circuit board is put through the reflow oven, during which all SMD(s) firmly attach to the circuit board, including the stiffener.

Figure 7:
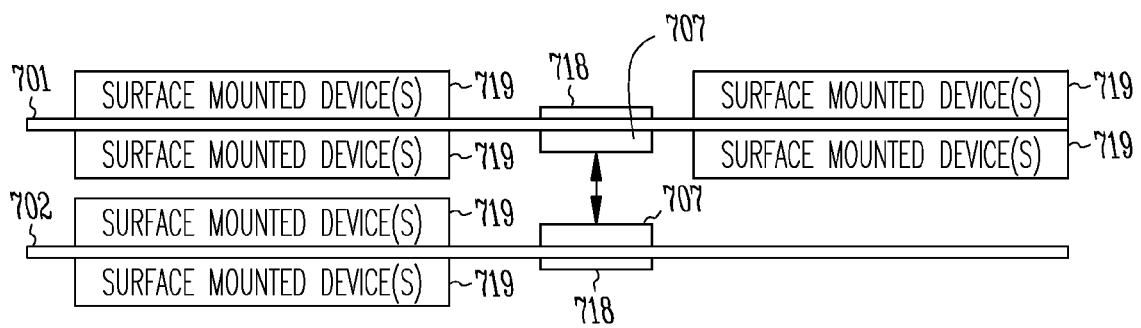
FIG. 7 illustrates by way of example and not limitation that SMDs may be mounted on either major surface of the flexible substrates, and illustrates a connector element on a surface and a stiffener board on the opposite surface.

FIG. 7 illustrates by way of example and not limitation, that SMD(s) 719 may be mounted on either major surface, and illustrates a connector element 707 on a surface and a stiffener board 718 on the opposite surface. The flex circuit may be assembled by mounting component(s) on one major surface of the flex circuit and then mounting component(s) on the other major surface of the flex circuit. The surface of the flex circuit may include a mounting pad, such as a solder pad, on which the component may be mounted to the surface. The process of mounting component(s) on a given surface may include mounting one or more SMD(s), a connector element or a stiffener board. That is, the connector element or stiffener board may be mounted on a surface of the flex circuit during the same process for mounting SMD(s) on the surface.

Figure 8:
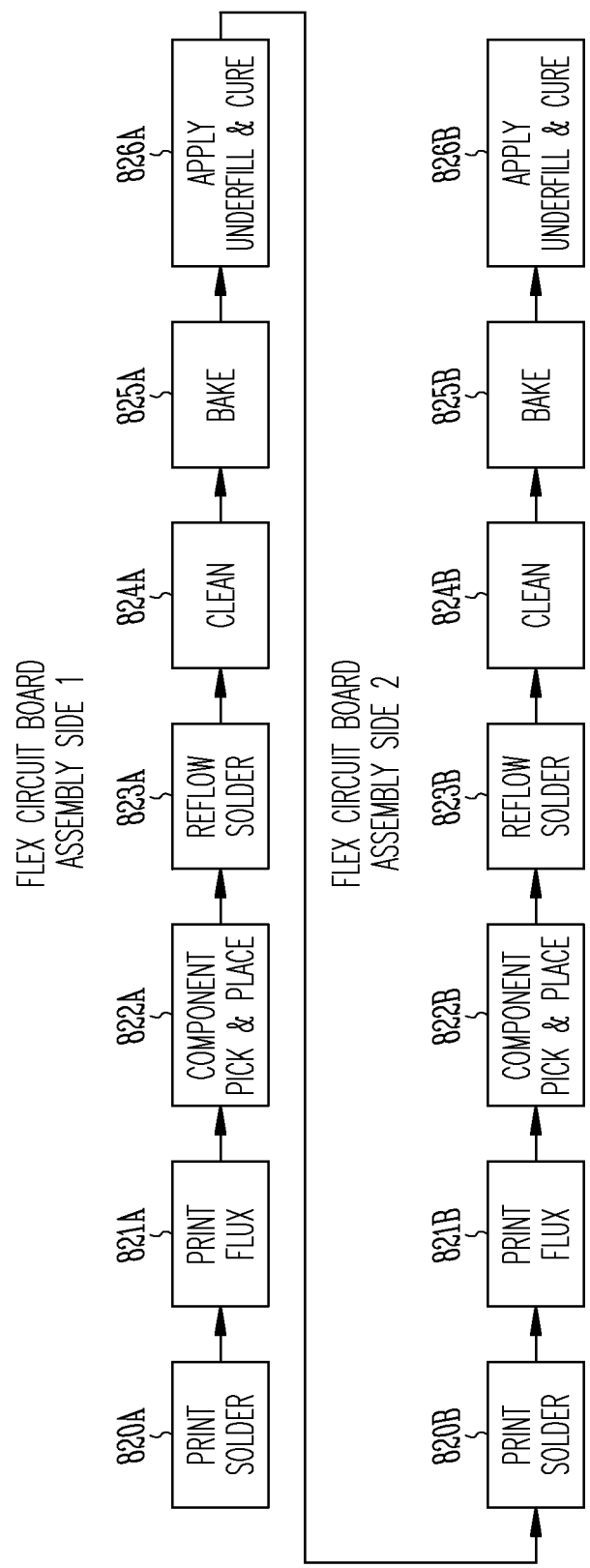
FIG. 8 illustrates a flow diagram for assembling a two-sided flex assembly, which may also be referred to as a flexible circuit assembly or a flex circuit assembly.

FIG. 8 illustrates a flow diagram for assembling a two-sided flex assembly, which may also be referred to as a flexible circuit assembly or flex circuit assembly. The two-sided flex assembly may be a flex circuit segment for a larger segmented flex assembly. The diagram illustrates the assembly of side 1 (e.g. including mounting SMD(s) on first major surface) and then the assembly of side 2 (e.g. including mounting SMD(s) on a second major surface). The process steps provide a high-level view of the process for assembling a flex assembly, and the illustrated steps are the same for both surfaces of the flex assembly. Assembly of the first side of the flex circuit may include printing solder 820A and printing flux 821A on the first side of the flex substrate. A pick and place mechanism may be used to place the SMD(s) 822A (e.g. SMDs, connector elements, and/or stiffener board) on the first side of the flex substrate according to the design of the system. After placing the SMD(s), the solder is reflowed 823A, and the assembly is cleaned 824A and baked 825A. Finally, an underfill may be applied and cured 826A. The second side of the flex circuit may be similarly assembled by printing solder 820B, printing flux 821B, picking and placing SMD(s) 822B, reflowing solder 823B, cleaning the assembly 824B, baking the assembly 825B, and applying an underfill and curing 826B.

Various embodiments of the present subject matter provide flex assemblies with reinforced board-to-board connectors fabricated at the surface mounted device (SMD) level of the flex circuit. By performing this reinforcement during the SMD assembly process, the present subject matter improves the reliability of board-to-board connectors without altering the flex fabrication process and without implementing additional hand assembly steps. Further, a different processing step is not required as the reinforcement may be applied using the same pick-and-place processing used to mount the devices on the flex assembly. For example, a pick and place machine may automatically place the stiffener board on the flex circuit in the same fashion as other SMD(s) and the stiffener board is secured to the flex circuit by solder during the reflow process. In contrast, previous methods would require additional frontend efforts by the circuit supplier or would require more manual processes, such in applying adhesive based attachments, after the SMD assembly process.

Figure 9:
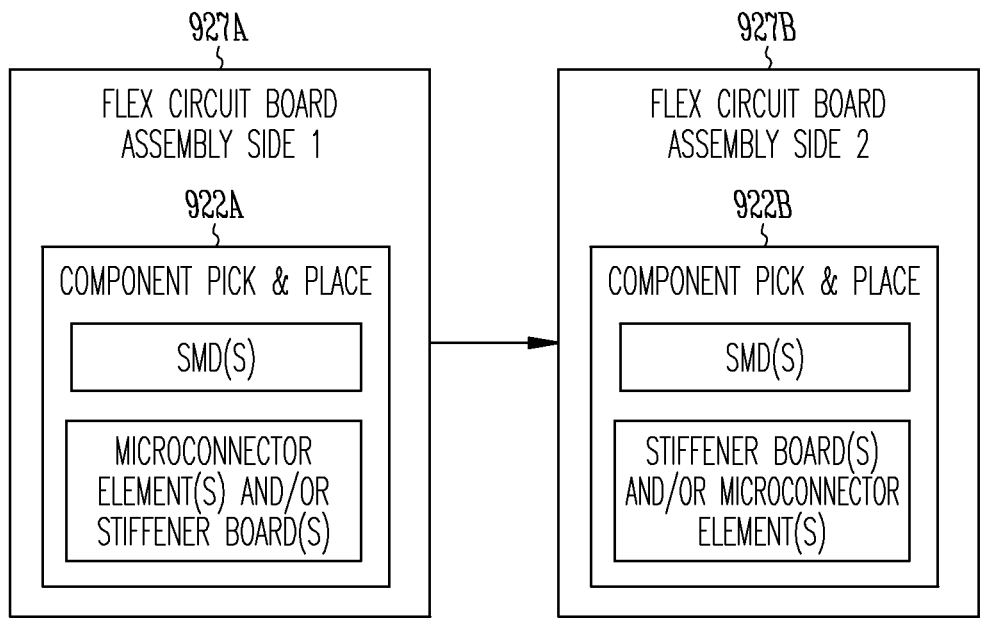
FIG. 9 illustrates a flow diagram for assembling SMDs and connector elements in a flex assembly, which also may be referred to as a flex circuit, and further illustrates by way of example and not limitation that SMDs may be mounted on either major surface of the flexible substrates, and also illustrates a connector element and a stiffener board mounted on opposing surfaces.

FIG. 9 illustrates a flow diagram for assembling SMDs and connector elements in a flex assembly, which may also be referred to as a flex circuit, and further illustrates by way of example and not limitation that SMDs may be mounted on either major surface of the flexible substrates, and also illustrates a connector element and a stiffener board mounted on opposing surfaces. The flex circuit may be a flex circuit segment for a larger segmented flex assembly. The first side of the flex circuit is assembled 927A, and this process includes picking and placing components 922A on the surface of the first side. The second side of the flex circuit is assembled 927B, and this process similarly includes picking and placing components 922B. Depending on the design of the system, the components that are picked and placed may include one or more SMD(s), one or more connector element(s), or one or more stiffener board(s). All of the SMD(s) may be placed on the surface before the solder is reflowed.

Figure 10:
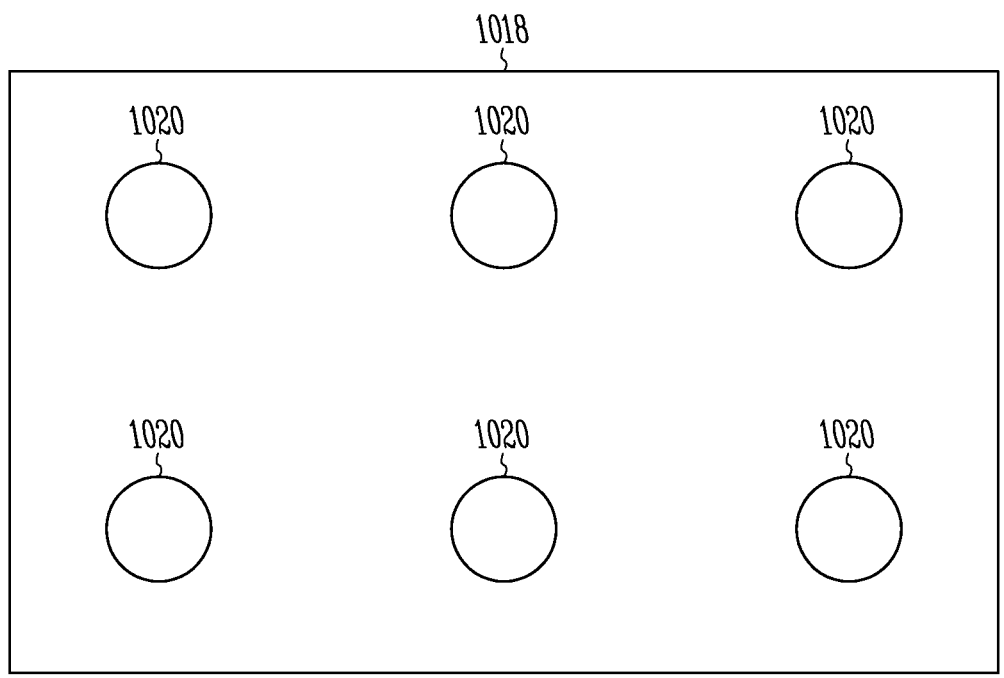
FIG. 10 illustrates, by way of example and not limitation, a footprint of a stiffener board.

FIG. 10 illustrates, by way of example and not limitation, a footprint of a stiffener board 1018. The footprint is generally compatible with the footprint of a connector element. By way of example and not limitation, a rectangular stiffener board may be compatible with a rectangular connector element. The connector element may include larger solder bumps around the periphery of the connector element to provide mechanical coupling. The connector element may also include smaller solder bumps spaced closer together to provide electrical coupling between the connector and the flex circuit substrate. The stiffener may similarly include the larger solder bumps 1020 around the periphery to provide the mechanical connection. However, according to some embodiments, the stiffener board does not have an electrical function and thus does not include the smaller solder bumps. The stiffener material can have solder balls populated to mate with each pad, or only selectively populate some. The stiffener can then be underfilled per the normal process as well for extra support and pad protection. The size of stiffener material may be less than 25 mm$^2$ in some embodiments. The size of the stiffener material may be less than 10 mm$^2$. In some embodiment, the size of the stiffener material may be less than 5 mm$^2$.

This document relates to flex assemblies with board-to-board connectors to connect a flex or flex circuit assembly to another flex circuit or flex circuit assembly. As identified above, these flex assemblies may be implemented in hearing assistance devices. It is understood that any hearing assistance device may be used without departing from the scope and the devices depicted in the figures are intended to demonstrate the subject matter, but not in a limited, exhaustive, or exclusive sense. It is also understood that the present subject matter can be used with a device designed for use in the right ear or the left ear or both ears of the wearer.

Examples of hearing assistance devices include hearing aids, and examples of hearing aids include but are not limited to, behind-the-ear (BTE), in-the-ear (ITE), in-the-canal (ITC), receiver-in-canal (RIC), or completely-in-the-canal (CIC) type hearing aids. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the user, including but not limited to receiver-in-canal (RIC) or receiver-in-the-ear (RITE) designs. The present subject matter can also be used in hearing assistance devices generally, such as cochlear implant type hearing devices and such as deep insertion devices having a transducer, such as a receiver or microphone, whether custom fitted, standard, open fitted or occlusive fitted. It is understood that other hearing assistance devices not expressly stated herein may be used in conjunction with the present subject matter.

It is understood that digital hearing aids include a processor. In digital hearing aids with a processor programmed to provide corrections to hearing impairments, programmable gains are employed to tailor the hearing aid output to a wearer's particular hearing impairment. The processor may be a digital signal processor (DSP), microprocessor, microcontroller, other digital logic, or combinations thereof. The processing of signals referenced in this application can be performed using the processor. Processing may be done in the digital domain, the analog domain, or combinations thereof. Processing may be done using subband processing techniques. Processing may be done with frequency domain or time domain approaches. Some processing may involve both frequency and time domain aspects. For brevity, in some examples drawings may omit certain blocks that perform frequency synthesis, frequency analysis, analog-to-digital conversion, digital-to-analog conversion, amplification, and certain types of filtering and processing. In various embodiments the processor is adapted to perform instructions stored in memory which may or may not be explicitly shown. Various types of memory may be used, including volatile and nonvolatile forms of memory. In various embodiments, instructions are performed by the processor to perform a number of signal processing tasks. In such embodiments, analog components are in communication with the processor to perform signal tasks, such as microphone reception, or receiver sound embodiments (i.e., in applications where such transducers are used). In various embodiments, different realizations of the block diagrams, circuits, and processes set forth herein may occur without departing from the scope of the present subject matter.

It is understood that the hearing assistance device may support wireless communications. In various embodiments the wireless communications can include standard or non-standard communications. Some examples of standard wireless communications include link protocols including, but not limited to, Bluetooth™, IEEE 802.11 (wireless LANs), 802.15 (WPANs), 802.16 (WiMAX), cellular protocols including, but not limited to CDMA and GSM, ZigBee, and ultra-wideband (UWB) technologies. Such protocols support radio frequency communications and some support infrared communications. The wireless communication maybe implemented using radio, ultrasonic, optical, or forms of wireless communication. It is understood that the standards which can be used include past and present standards. It is also contemplated that future versions of these standards and new future standards may be employed without departing from the scope of the present subject matter. The wireless communications may support a connection from other devices. Such connections include, but are not limited to, one or more mono or stereo connections or digital connections having link protocols including, but not limited to 802.3 (Ethernet), 802.4, 802.5, USB, ATM, Fibre-channel, Firewire or 1394, InfiniBand, or a native streaming interface. In various embodiments, such connections include all past and present link protocols. It is also contemplated that future versions of these protocols and new future standards may be employed without departing from the scope of the present subject matter.

Hearing assistance devices typically include an enclosure or housing, a microphone, hearing assistance device electronics including processing electronics, and a speaker or receiver. It is understood that in various embodiments the microphone is optional. It is understood that in various embodiments the receiver is optional. Antenna configurations may vary and may be included within an enclosure for the electronics or be external to an enclosure for the electronics.

This application is intended to cover adaptations or variations of the present subject matter. It is to be understood that the above description is intended to be illustrative, and not restrictive. The scope of the present subject matter should be determined with reference to the appended claims, along with the full scope of legal equivalents to which such claims are entitled.

What is claimed is:

1. A system, comprising:
  a first flexible substrate with a first number of conductors, the first flexible substrate configured to be mechanically flexed, and the first flexible substrate having at least a first solder pad, a second solder pad and third solder pad;
  a surface mounted device (SMD) soldered to the first solder pad of the first flexible substrate and connected to at least some of the first number of conductors;
  a first board-to-board connector element soldered to the second solder pad that is on a first side of the first flexible substrate, the first board-to-board connector element connected to at least some of the first number of conductors, the first board-to-board connector element being configured to mechanically connect to a second board-to-board connector element on a second flexible substrate and to electrically connect at least some of the first number of conductors in the first flexible substrate to at least some conductors in the second flexible substrate; and
  a stiffener board soldered to a third solder pad that is on a second side of the first flexible substrate opposite the second solder pad and the first board-to-board connector element.

2. The system of claim 1, wherein the stiffener board includes a rigid material that is not solid metal.

3. The system of claim 1, wherein the stiffener board includes FR4 board, acrylic, epoxy, polyimide, kapton, ceramic, or silicon.

4. The system of claim 1, wherein the first board-to-board connector element includes one of a board-to-board connector plug or a board-to-board connector receptacle, and the second board-to-board connector element includes the other of the board-to-board connector plug or the board-to-board connector receptacle.

5. The system of claim 1, wherein the SMD is mounted on the first side of the first flexible substrate.

6. The system of claim 1, wherein the SMD is mounted on the second side of the first flexible substrate.

7. The system of claim 1, wherein the SMD is a first SMD mounted on the first side of the first flexible substrate, the system further including a second SMD mounted on the second side of the first flexible substrate.

8. The system of claim 1, wherein the stiffener board is configured to provide mechanical support without providing an electrical function for the system.

9. A system, comprising:
  a first flex circuit segment, including:
    a first flexible substrate with a first number of conductors, the first flexible substrate configured to be mechanically flexed, and the first flexible substrate having at least a first solder pad, a second solder pad and third solder pad;
    a first surface mounted device (SMD soldered to the first solder pad of the first flexible substrate and connected to at least some of the first number of conductors;
    a first board-to-board connector element soldered to the second solder pad of the first flexible substrate that is on a first side of the first flexible substrate, the first board-to-board connector element connected to at least some of the first number of conductors; and
    a first stiffener board soldered to a third solder pad of the first flexible substrate that is on a second side of the first flexible substrate opposite the second solder pad and the first board-to-board connector element; and
  a second flex circuit segment, including:
    a second flexible substrate with a second number of conductors, the second flexible substrate configured to be mechanically flexed and the second flexible substrate having at least a first solder pad, a second solder pad and third solder pad;
    a second SMD soldered to the first solder pad of the second flexible substrate and connected to at least some of the second number of conductors;
    a second board-to-board connector element soldered to the second solder pad that is on a first side of the second flexible substrate, the second board-to-board connector element connected to at least some of the second number of conductors, wherein the first and second board-to-board connector elements are configured to mechanically connect to each and to electrically connect at least some of the first number of conductors to at least some of the second number of conductors; and a second stiffener board soldered to a third solder pad that is on a second side of the second flexible substrate opposite the second solder pad and the second board-to-board connector element.

10. The system of claim 9, wherein a first mounting pad is used to mount the first board-to-board connector element to the first side of the first flexible substrate, and a second mounting pad is used to mount the second board-to-board connector element to the second side of the first flexible substrate, and wherein the first mounting pad and the second mounting pad have compatible designs with identical footprints, and wherein outer solder balls are used to mechanically connect the first board-to-board connector element to the first mounting pad.

11. The system of claim 9, wherein each of the first and second flexible substrates have a rectangular footprint.

12. The system of claim 9, wherein the system is a hearing assistance system, the first flex circuit segment includes a main board, and the second flex circuit segment includes at least one microphone.

13. The system of claim 12, wherein the first connector element mounted to the main board is a board-to-board connector receptacle, and wherein the main board includes another board-to-board connector receptacle mounted to one of the first or second sides, and another stiffener board mounted to the other of the first or second sides.

14. The system of claim 9, wherein each of the first and second stiffener boards includes a rigid material that is not solid metal.

* * * * *